US009305886B2

(12) United States Patent
Shao et al.

(10) Patent No.: US 9,305,886 B2
(45) Date of Patent: Apr. 5, 2016

(54) INTEGRATED CIRCUITS HAVING CRACK-STOP STRUCTURES AND METHODS FOR FABRICATING THE SAME

(71) Applicant: GLOBALFOUNDRIES Singapore Pte. Ltd., Singapore (SG)

(72) Inventors: Wei Shao, Singapore (SG); Fan Zhang, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 106 days.

(21) Appl. No.: 14/132,368

(22) Filed: Dec. 18, 2013

(65) Prior Publication Data

US 2015/0171025 A1   Jun. 18, 2015

(51) Int. Cl.

| | |
|---|---|
| H01L 21/4763 | (2006.01) |
| H01L 23/00 | (2006.01) |
| H01L 21/768 | (2006.01) |
| H01L 21/311 | (2006.01) |
| H01L 23/522 | (2006.01) |
| H01L 21/263 | (2006.01) |

(52) U.S. Cl.
CPC .......... *H01L 23/562* (2013.01); *H01L 21/2633* (2013.01); *H01L 21/31116* (2013.01); *H01L 21/76805* (2013.01); *H01L 21/76879* (2013.01); *H01L 23/5226* (2013.01); *H01L 2924/0002* (2013.01)

(58) Field of Classification Search
CPC ... H01L 25/50; H01L 23/528; H01L 25/0657; H01L 23/481; H01L 21/76877; H01L 23/49827; H01L 23/5226; H01L 24/11; H01L 24/81; H01L 2224/0231; H01L 24/03; H01L 2224/13147; H01L 23/49811
See application file for complete search history.

(56) References Cited

U.S. PATENT DOCUMENTS

| | | | | |
|---|---|---|---|---|
| 2004/0115928 | A1* | 6/2004 | Malhotra et al. | 438/639 |
| 2008/0012142 | A1* | 1/2008 | Mehta et al. | 257/762 |
| 2008/0090402 | A1* | 4/2008 | Bonilla et al. | 438/599 |
| 2010/0038790 | A1* | 2/2010 | Bonilla et al. | 257/758 |
| 2010/0164121 | A1* | 7/2010 | Feustel et al. | 257/774 |
| 2012/0211748 | A1* | 8/2012 | Miccoli et al. | 257/52 |
| 2013/0187280 | A1 | 7/2013 | Yuan | |

* cited by examiner

*Primary Examiner* — Robert Bachner
(74) *Attorney, Agent, or Firm* — Ingrassia Fisher & Lorenz, P.C.

(57) ABSTRACT

Integrated circuits and methods for fabricating integrated circuits are provided. In one example, a method for fabricating an integrated circuit includes fabricating a crack-stop structure that extends through a plurality of metallization layers above a semiconductor substrate. The plurality of metallization layers includes a first metallization layer and a second metallization layer that overlies the first metallization layer. Fabricating the crack-stop structure includes forming a first via-bar overlying and coupled to a first metal line of the first metallization layer that is disposed in a first ILD layer of dielectric material. The first via-bar is disposed in a second ILD layer of dielectric material and has a first width. A second metal line of the second metallization layer that is in the second ILD layer is formed overlying and coupled to the first via-bar. The second metal line has a second width that is from about 1 to about 5 times the first width.

14 Claims, 4 Drawing Sheets

INTEGRATED CIRCUITS HAVING CRACK-STOP STRUCTURES AND METHODS FOR FABRICATING THE SAME

TECHNICAL FIELD

The technical field relates generally to integrated circuits and methods for fabricating integrated circuits, and more particularly relates to integrated circuits having crack-stop structures to arrest cracking and/or delamination of or between metallization layers that form interconnect structures of the integrated circuits and methods for fabricating such integrated circuits.

BACKGROUND

Integrated circuits (ICs) typically include a plurality of semiconductor devices and interconnect wiring. Networks of metal interconnect wiring are often used to connect the semiconductor devices from the semiconductor portion of the substrate. Multiple levels of metal interconnect wiring form a plurality of metallization layers above the semiconductor portion of the substrate and are connected together to form a back-end-of-the-line ("BEOL") interconnect structure. Within such a structure, metal lines run parallel to the substrate in the metallization layers and conductive vias run perpendicular to the substrate between the metallization layers to interconnect the metal lines.

High performance of contemporary ICs may be achieved using a highly conductive metal, such as copper, as the interconnect metal of the BEOL interconnect structure, which also employs a low dielectric constant material or dielectric material as an interlevel dielectric (ILD) layer or layers. To help hold the highly conductive interconnect metal to the dielectric material, a metal liner material, such as tantalum or tantalum nitride, is deposited onto the dielectric material to form a metal liner layer. Then, a conductive metal seed layer, such as a layer of copper or copper alloy, is formed on the metal liner layer and the highly conductive metal is deposited over the conductive metal seed layer to form a metal interconnect wire.

During normal operation, the temperature of the IC will generally increase due to, for example, the relatively large power consumption by the semiconductor devices. This increased temperature can produce relatively high thermal stresses in the IC including in the BEOL interconnect structure due to the thermal expansion differences between the conductive metal(s) and the dielectric material(s) that form the interconnect structure. These relatively high thermal stresses can result in cracking and/or delamination (e.g., peeling) of or between the various metallization layers. To address this issue, one approach has been to fabricate crack-arresting or crack-stop structures that extend through the metallization layers perpendicular to the substrate. These crack-stop structures help hold the BEOL interconnect structure together as well as help prevent diffusion of moisture into the BEOL interconnect structure, which can further increase cracking and/or delamination of or between the metallization layers. Unfortunately, current crack-stop structures are not always effective at holding the BEOL interconnect structure together, and can fail or delamination themselves allowing cracking and/or delamination of or between the metallization layers.

Accordingly, it is desirable to provide integrated circuits having crack-stop structures with improved robustness to arrest cracking and/or delamination of or between metallization layers disposed above semiconductor substrates and methods for fabricating such integrated circuits. Furthermore, other desirable features and characteristics of the present invention will become apparent from the subsequent detailed description and the appended claims, taken in conjunction with the accompanying drawings and this background.

BRIEF SUMMARY

Integrated circuits and methods for fabricating integrated circuits are provided herein. In accordance with an exemplary embodiment, a method for fabricating an integrated circuit includes fabricating a crack-stop structure that extends through a plurality of metallization layers above a semiconductor substrate. The plurality of metallization layers includes a first metallization layer and a second metallization layer that overlies the first metallization layer. Fabricating the crack-stop structure includes forming a first via-bar overlying and coupled to a first metal line of the first metallization layer that is disposed in a first ILD layer of dielectric material. The first via-bar is disposed in a second ILD layer of dielectric material and has a first width. A second metal line of the second metallization layer is formed overlying and coupled to the first via-bar. The second metallization layer is disposed in the second ILD layer. The second metal line has a second width that is from about 1 to about 5 times the first width.

In accordance with another exemplary embodiment, a method for fabricating an integrated circuit is provided. The method includes fabricating a crack-stop structure that extends through a plurality of metallization layers above a semiconductor substrate. The plurality of metallization layers includes a first metallization layer and a second metallization layer that overlies the first metallization layer. Fabricating the crack-stop structure includes providing a first ILD layer of dielectric material and the first metallization layer disposed in the first ILD layer. The first metallization layer includes a first metal line. A second ILD layer of dielectric material is deposited overlying the first ILD layer. A via-bar trench is etched in the second ILD layer over the first metal line to expose an upper surface of the first metal line. The via-bar trench has a first width. An upper portion of the second ILD layer adjacent to the via-bar trench is etched to define a metal line trench that is over and open to the via-bar trench. The metal line trench has a second width that is from about 1 to about 5 times the first width. A first via-bar is formed in the via-bar trench coupled to the first metal line. A second metal line is formed in the metal line trench coupled to the first via-bar.

In accordance with another exemplary embodiment, an integrated circuit is provided. The integrated circuit includes a semiconductor substrate. A first ILD layer of dielectric material overlies the semiconductor substrate and a second ILD layer of dielectric material overlies the first ILD layer. A plurality of metallization layers is disposed above the semiconductor substrate. The plurality of metallization layers include a first metallization layer that is disposed in the first ILD layer and a second metallization layer that is disposed in the second ILD layer. A crack-stop structure extends through the plurality of metallization layers. The crack-stop structure includes a first via-bar that overlies and is coupled to a first metal line of the first metallization layer. The first via-bar is disposed in the second ILD layer and has a first width. A second metal line of the second metallization layer overlies and is coupled to the first via-bar. The second metal line has a second width that is from about 1 to about 5 times the first width.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
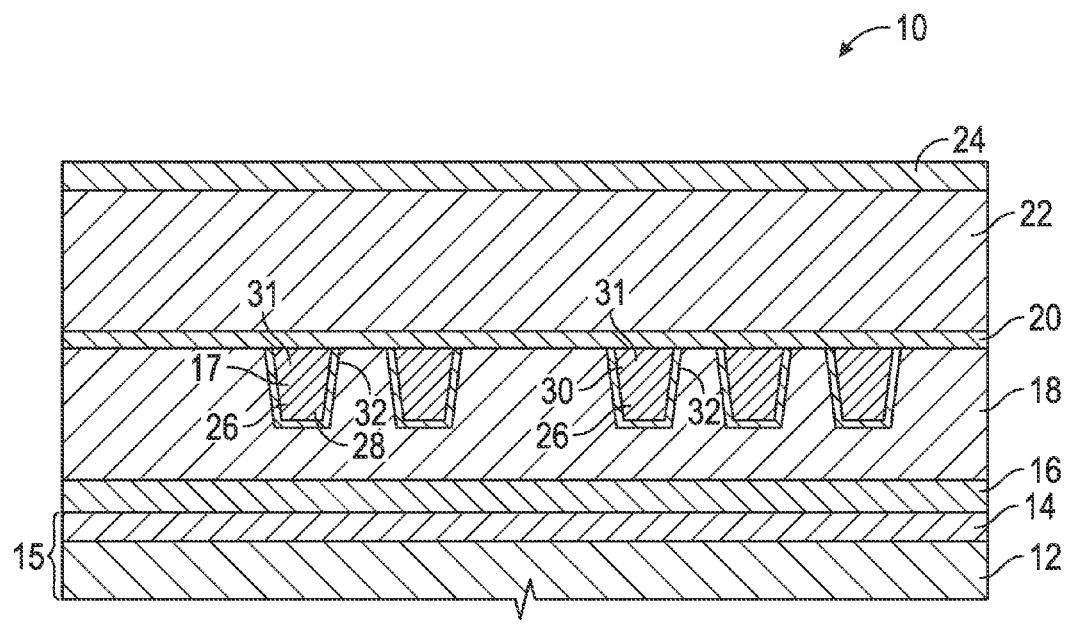
FIG. 1 illustrates, in cross-sectional view, an integrated circuit during an intermediate fabrication stage in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to integrated circuits having crack-stop structures to arrest cracking and/or delamination of or between metallization layers that form interconnect structures of the integrated circuits. A method for fabricating such an integrated circuit includes fabricating a crack-stop structure that extends through a plurality of metallization layers above a semiconductor substrate. The plurality of metallization layers includes a first metallization layer and a second metallization layer that overlies the first metallization layer.

In an exemplary embodiment, fabricating the crack-stop structure includes providing a first ILD layer of dielectric material and the first metallization layer disposed in the first ILD layer. The first metallization layer includes a first metal line. A second ILD layer of dielectric material is deposited overlying the first ILD layer. A via-bar trench is etched in the second ILD layer over the first metal line to expose an upper surface of the first metal line. The via-bar trench has a first width. An upper portion of the second ILD layer adjacent to the via-bar trench is etched to define a metal line trench that is over and open to the via-bar trench. In an exemplary embodiment, the metal line trench has a second width that is from about 1 to about 5 times the first width.

A first via-bar is formed in the via-bar trench coupled to the first metal line and has a width that corresponds to the first width of the via-bar trench. A second metal line is formed in the metal line trench coupled to the first via-bar and has a width that corresponds to the second width of the metal line trench. In an exemplary embodiment, it has been found that by forming the crack-stop structure in which the second metal line has a width that is from about 1 to about 5 times the width of the first via-bar, the first via-bar is formed such that it penetrates or gouges into the first metal line to enhance coupling between the first and second metallization layers and the corresponding first and second ILD layers to help arrest cracking and/or delamination of or between these metallization layers.

FIGS. 1-7 illustrate, in cross-sectional view, an integrated circuit (IC) 10 during various fabrication stages. The described process steps, procedures, and materials are to be considered only as exemplary embodiments designed to illustrate to one of ordinary skill in the art methods for practicing the invention; the invention is not limited to these exemplary embodiments. Various steps in the manufacture of ICs are well known and so, in the interest of brevity, many conventional steps will only be mentioned briefly herein or will be omitted entirely without providing the well-known process details.

FIG. 1 illustrates a portion of the IC 10 during an intermediate fabrication stage in accordance with an exemplary embodiment. The IC 10 includes a substrate 12 that may represent any appropriate carrier material, such as silicon or silicon-based materials, and the like. Additionally, the IC 10 may include a semiconductor layer 14 that may be made up of active areas (not shown) in which a plurality of active and/or passive circuit elements (not shown), such as transistors, capacitors, resistors, and the like may be formed. Depending on the overall design strategy employed for the IC 10, the substrate 12 may in some cases be a substantially crystalline substrate material (i.e. bulk silicon), whereas in other instances the substrate 12 may be formed on the basis of a silicon-on-insulator (SOI) architecture, in which a buried insulating layer (not shown) may be provided between the semiconductor layer 14 and the substrate 12. It should be appreciated that the semiconductor layer 14, even if including a substantially silicon-based material layer, may include other semiconducting materials, such as germanium, carbon, and the like, in addition to appropriate dopant species for establishing the requisite active area conductivity type for the circuit elements. Together the substrate 12 and the semiconductor layer 14 form a semiconductor substrate 15 (e.g., substrate with a semiconductor portion).

Figure 7:
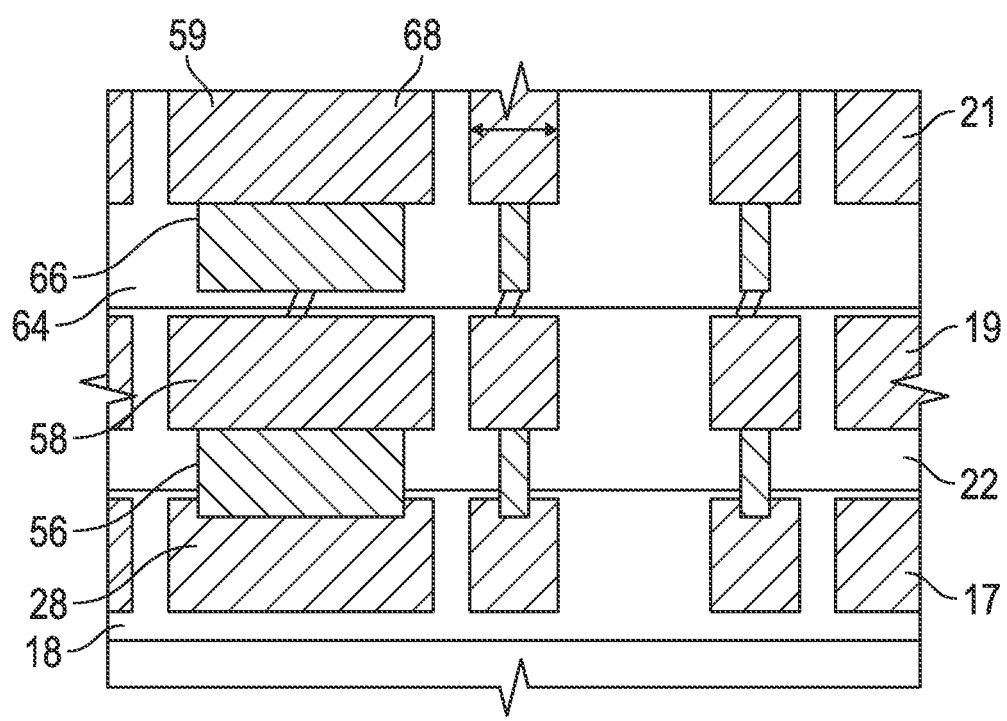
FIG. 7 illustrates, in cross-sectional view, an integrated circuit during a further advanced fabrication stage in accordance with an exemplary embodiment.

As illustrated, the IC 10 also includes a contact layer 16 that may be formed above the semiconductor layer 14. The contact layer 16 may be made up of a suitable dielectric material, such as silicon dioxide, silicon nitride, silicon oxynitride, and the like, and it may include a plurality of contact vias (not shown) as is well known in the art. Typically, the contact vias provide conductive electrical connections between one or more of the various circuit elements (not shown) disposed along the semiconductor layer 14 and the metallization layers 17, 19, and 21 (see also FIG. 7). It is to be appreciated, that the IC 10 may include the three metallization layers 17, 19, and 21 as illustrated in FIG. 7, or a different number of metallization layers but at least two metallization layers, for example more than three metallization layers, depending on the overall device requirements.

As illustrated in FIG. 1, above the semiconductor substrate 15 and contact layer 16, the IC 10 includes the metallization layer 17 that is disposed in an ILD layer 18 of dielectric material, an N-doped silicon carbide (SiCN) layer 20 that overlies the ILD layer 18, an ILD layer 22 of dielectric material that overlies the N-doped silicon carbide (SiCN) layer 20, and a hard mask layer 24 (e.g., silicon dioxide formed for example by the decomposition of a source material such as tetraethylorthosilicate (TEOS)). In an exemplary embodiment, the ILD layers 18 and 22 are each relatively thick independently with a thickness of from about 200 to about 1500 nm, and the N-doped SiCN layer 20 has a thickness of from about 10 to about 50 nm.

The metallization layer 17 includes a plurality of discrete and spaced apart metal lines 26 including a metal line 28 and a metal line 30. In particular, the metal lines 28 and 30 will be used to form crack-stop features as discussed in further detail below and the remaining metal lines may be used, for example, to form an interconnect structure (not shown) with the contact layer 16 below. Each of the metal lines 26 are formed of a conductive fill 31 and a liner 32. The conductive fill 31 is a highly conductive material such as copper and the liner is one or more layers of a liner-forming material such as tantalum (Ta), tantalum nitride (TaN), titanium (Ti), and/or titanium nitride (TiN) to help inhibit or prevent diffusion of the conductive fill 31 into the ILD layer 22.

The portion of the IC 10 above the contact layer 16 may be formed on the basis of well-known techniques. For example, the ILD layer 18 may be formed by depositing a low dielectric constant material such as silicon dioxide or the like overlying the contact layer 16 using a chemical vapor deposition (CVD) process and the top surface of the ILD layer 18 may be planarized using a chemical mechanical planarization (CMP) process. Next, the ILD layer 18 may be patterned and etched using, for example, a dry etching process to form metal line trenches, which are then filled by depositing a liner-forming material(s) and the conductive fill 31 into the metal line trenches using a physical vapor deposition (PVD) process and an electrochemical plating (ECP) process, respectively, to form the metal lines 26. Any overburden may be removed by CMP. Next, the N-doped SiCN layer 20 is deposited overlying the ILD layer 18 and the metal lines 26 using a CVD process. The ILD layer 22 is then deposited over the N-doped SiCN layer 20 followed by CMP and deposition of the hard mask layer 24.

Figure 2:
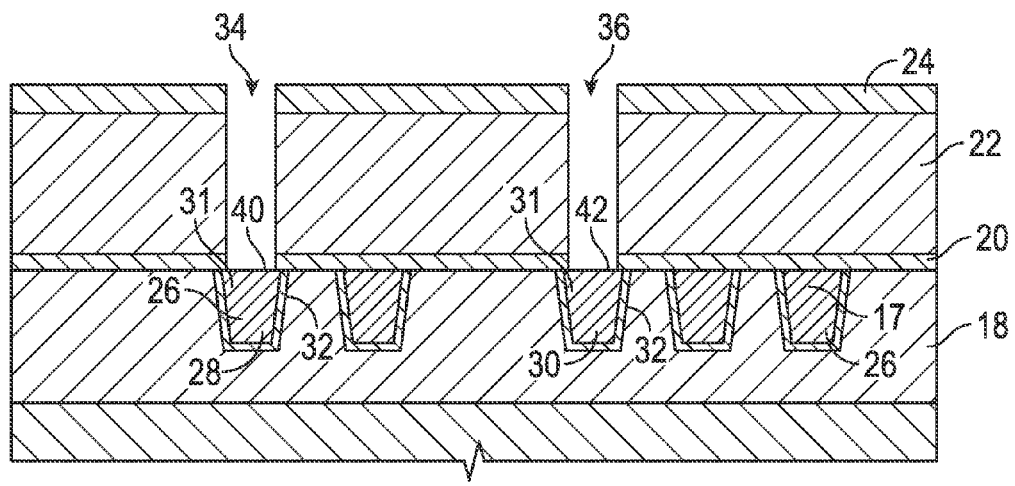
FIG. 2 illustrates, in cross-sectional view, an integrated circuit during a further advanced fabrication stage in accordance with an exemplary embodiment.
Figure 3:
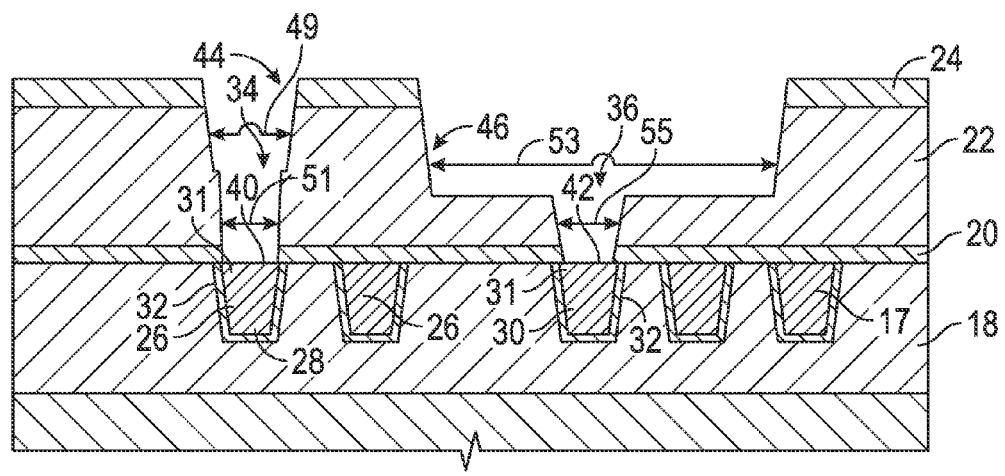
FIG. 3 illustrates, in cross-sectional view, an integrated circuit during a further advanced fabrication stage in accordance with an exemplary embodiment.

The process continues as illustrated in FIGS. 2-3 by patterning and etching through the hard mask layer 24 into the ILD layer 22 to form via-bar trenches 34 and 36. As illustrated, the via-bar trenches 34 and 36 extend completely through the ILD layer 22 exposing upper surfaces 40 and 42 of the metal lines 26 and 30. After formation of the via-bar trenches 34 and 36, the hard mask layer 24 is further patterned and etched to selectively remove upper portions of the ILD layer 22 adjacent to the via-bar trenches 34 and 36 to form metal line trenches 44 and 46. In an exemplary embodiment, the via-bar trenches 34 and 36 and the metal line trenches 44 and 46 are formed using well-known lithography and etching techniques such as via depositing and pattering of one or more photoresist layers and etching using the patterned photoresist layer(s) and a dry etching process (e.g., a plasma etching process).

As shown, the metal line trench 46 is substantially wider than the metal line trench 44 particularly in relationship to the corresponding widths of the via-bar trenches 34 and 36. As will be discussed in further detail below, the metal line trench 46 is provided primarily to illustrate the difference that the width of the metal trench to the width of the via-bar trench makes in the formation of a resulting crack-stop structure. In an exemplary embodiment, the width (indicated by double headed arrow 49) of the metal line trench 44 is from about 1 to about 5 times, such as from about 2 to about 5 times, for example from about 2 to about 4 times the width (indicated by double headed arrow 51) of the via-bar trench 34. In an exemplary embodiment, the width (indicated by double headed arrow 53) of the metal line trench 46 is at least about 5.5 times or greater, for example from about 5.5 to about 100 times the width (indicated by double headed arrow 55) of the via-bar trench 36.

Figure 4:
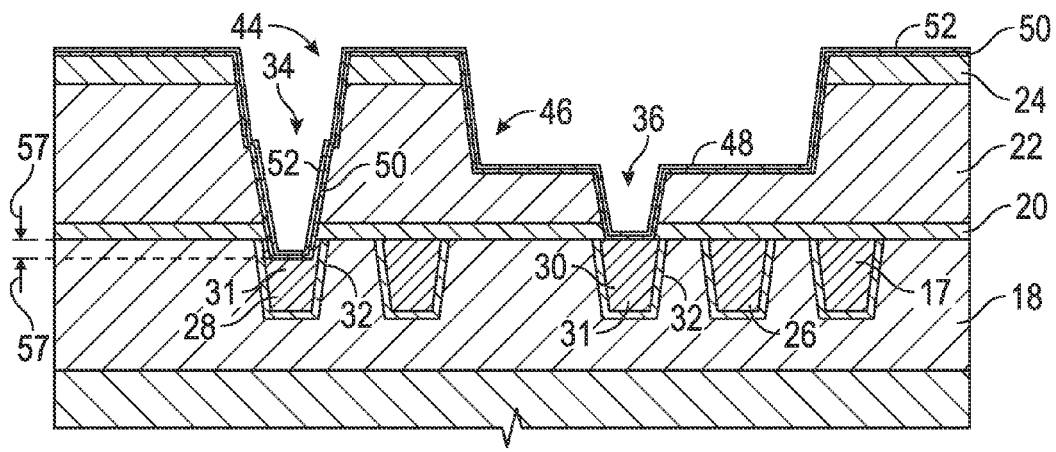
FIG. 4 illustrates, in cross-sectional view, an integrated circuit during a further advanced fabrication stage in accordance with an exemplary embodiment.

FIG. 4 illustrates the portion of the IC 10 during a further advanced fabrication stage in accordance with an exemplary embodiment. A liner-forming material(s) is deposited overlying a top surface of the hard mask layer 24, the sidewalls of the ILD layer 22 that define the via-bar trenches 34 and 36 and the metal line trenches 44 and 46, and the upper surfaces 40 and 42 of the metal lines 26 and 28 to form a liner 50. In an exemplary embodiment, the liner-forming material(s) includes Ta, TaN, Ti, and/or TiN and is deposited using a PVD process. In one example, the liner 50 is formed by initially depositing TaN followed by Ta using a PVD process to form a liner layer and portions of the liner layer are etched back using an ion bombardment dry etching process. Additional liner-forming material (e.g., Ta) is then deposited onto the etched back liner layer using a PVD process to complete formation of the liner 50. As illustrated and in accordance with an exemplary embodiment, it has been found that a portion of the liner 50 that is formed in the via-bar trench 34 penetrates (e.g., gouges or punches through) into the metal line 28 while the liner 50 that is formed in the via-bar trench 36 does not substantially penetrate into the metal line 30. Without being limited by theory, it is believed that by having a via-bar trench width to metal line trench width ratio of from about 1:1 to about 1:5 and further, by using a physical vapor deposition process and/or an ion bombardment dry etching process to form the liner 50, energy from one or both of these processes is condensed as the energy passes through the metal line trench 44 and the via-bar trench 34 and is focused on the top 40 of the metal line 28 to help drive the liner-forming material into the metal line 28. In an exemplary embodiment, during formation of the liner 50, the liner-forming material penetrates into the metal line 28 a depth (indicated by arrows 57) of about 50 Å or greater, such as from about 100 to about 470 Å.

As illustrated, a copper seed layer 52 is then deposited overlying the liner 50. In an exemplary embodiment, the copper seed layer 52 is deposited using a PVD process.

Figure 5:
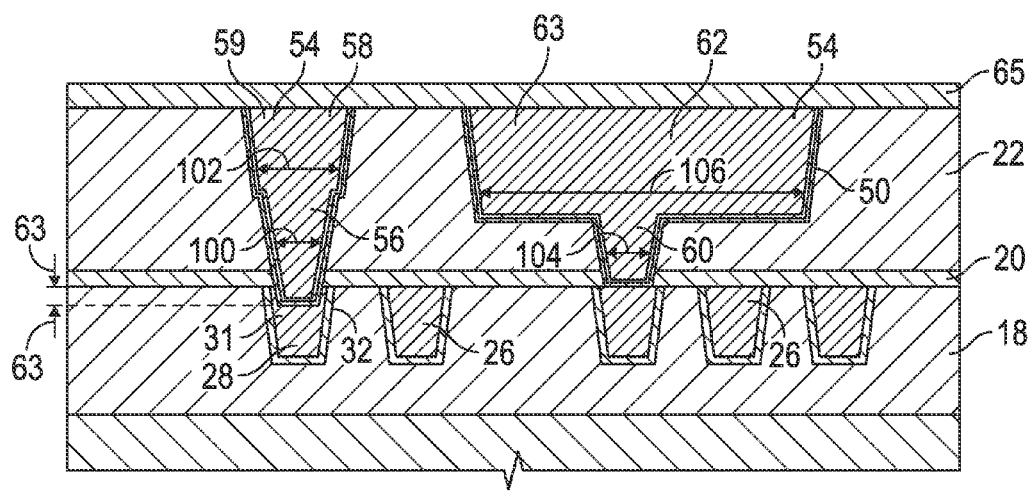
FIG. 5 illustrates, in cross-sectional view, an integrated circuit during a further advanced fabrication stage in accordance with an exemplary embodiment.

The process continues as illustrated in FIG. 5 by depositing a conductive metal fill 54 overlying the copper seed layer to form a via-bar 56 and a metal line 58 in the via-bar trench 34 and metal line trench 44, respectively, and a via-bar 60 and a metal line 62 in the via-bar trench 36 and metal line trench 46, respectively. As illustrated, the metal line 28, the via-bar 56, and the metal line 58 together define a crack-stop feature 59, and the metal line 30, the via-bar 60, and the metal line 62 together define a crack-stop feature 63.

In an exemplary embodiment, the widths of the metal line 58, the via-bar 56, the metal line 62, and the via-bar 60 correspond to the widths 49, 51, 53, and 55 of the corresponding trenches. In an exemplary embodiment, the width (indicated by double headed arrow 102) of the metal line 58 is from about 1 to about 5 times, such as from about 2 to about 5 times, for example from about 2 to about 4 times the width (indicated by double headed arrow 100) of the via-bar 56. In an exemplary embodiment, the width (indicated by double headed arrow 106) of the metal line 62 is at least about 5.5 times or greater, for example from about 5.5 to about 100 times the width (indicated by double headed arrow 104) of the via-bar 60. As illustrated, the via-bar 56 gouges or penetrates into the metal line 28 while the via-bar 60 does not substantially penetrate into the metal line 30. In an exemplary embodiment, the via-bar 56 gouges into the metal line 30 a depth (indicated by arrows 63) of about 50 Å or greater, such as from about 100 to about 470 Å to enhance coupling between the metallization layers 17 and 19 and the ILD layers 18 and 22 to help arrest cracking and/or delamination of or between the metallization layers 17 and 19.

The process continues by planarizing the IC 10 using a CMP process to remove any excess conductive fill 54 and the hard mask layer 24. An N-doped SiCN layer 65 is deposited overlying the ILD layer 22.

Figure 6:
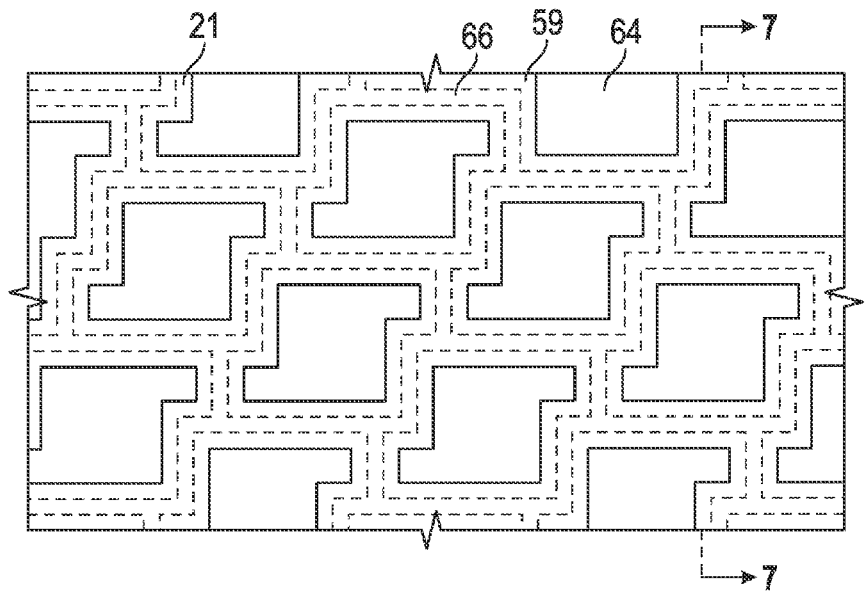
FIG. 6 illustrates, in cross-sectional view, an integrated circuit during a further advanced fabrication stage in accordance with an exemplary embodiment.

Referring to FIGS. 6-7, as discussed above, the crack-stop feature 59 can be formed through two (see FIG. 5) or more metallization layers 17, 19, and 21 and ILD layers 18, 22, and 64 (see FIGS. 6-7 in which "//" represent 0, 1, or more than 1 interposing metallization and ILD layers with the corresponding metal lines and via-bars). As such, the cracks-stop feature 59 includes metal lines 28, 58, and 68 and via-bars 56 and 66 that correspondingly gouge or penetrate into metal lines 28 and 58, respectively, as discussed above. As illustrated, the crack-stop feature 59 forms a wall that can be routed or arranged as desired to help hold the metallization layers 17, 19, and 21 and the ILD layers 18, 22, and 64 together to help inhibit cracking and/or delamination and further, to help prevent diffusion of moisture into the IC 10, which can also promote cracking and/or delamination in the IC 10.

Accordingly, integrated circuits including devices and methods for fabricating such integrated circuits have been described. In an exemplary embodiment, an integrated circuit is fabricated by forming a crack-stop structure that extends through a plurality of metallization layers above a semiconductor substrate. The plurality of metallization layers includes a first metallization layer and a second metallization layer that overlies the first metallization layer. Fabricating the crack-stop structure includes forming a first via-bar overlying and coupled to a first metal line of the first metallization layer that is disposed in a first ILD layer of dielectric material. The first via-bar is disposed in a second ILD layer of dielectric material and has a first width. A second metal line of the second metallization layer that is in the second ILD layer is formed overlying and coupled to the first via-bar. The second metal line has a second width that is from about 1 to about 5 times the first width.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit, the method comprising:
   fabricating a crack-stop structure extending through a plurality of metallization layers above a semiconductor substrate, wherein the plurality of metallization layers comprises a first metallization layer and a second metallization layer that overlies the first metallization layer, and wherein fabricating the crack-stop structure comprises:
      forming a first via-bar overlying and coupled to a first metal line of the first metallization layer that is disposed in a first ILD layer of dielectric material, wherein the first via-bar is disposed in a second ILD layer of dielectric material and has a first width; and
      forming a second metal line of the second metallization layer overlying and coupled to the first via-bar, wherein the second metallization layer is disposed in the second ILD layer, wherein the second metal line has a second width that is from about 1 to about 5 times the first width, and wherein forming the first via-bar comprises forming the first via-bar gouging into the first metal line a depth of about 50 Å or greater, wherein forming the first via-bar and the second metal line comprises:
         forming a liner in a via-bar trench and a metal line trench, wherein forming the liner comprises:
            depositing a liner-forming material to form a liner layer in the via-bar trench and the metal line trench; and
            etching back portions of the liner layer using an ion bombardment dry etching process so as to drive the liner-forming material into first metal line; and
         depositing a conductive metal fill in the via-bar trench and the metal line trench overlying the liner.

2. The method of claim 1, wherein forming the second metal line comprises forming the second metal line having the second width of from about 2 to about 5 times the first width.

3. The method of claim 1, wherein forming the second metal line comprises forming the second metal line having the second width of from about 2 to about 4 times the first width.

4. The method of claim 1, wherein forming the first via-bar comprises forming the first via-bar gouging into the first metal line a depth of from about 100 to about 470 Å.

5. A method for fabricating an integrated circuit, the method comprising:
   fabricating a crack-stop structure extending through a plurality of metallization layers above a semiconductor substrate, wherein the plurality of metallization layers comprises a first metallization layer and a second metallization layer that overlies the first metallization layer, and wherein fabricating the crack-stop structure comprises:
      providing a first ILD layer of dielectric material and the first metallization layer that is disposed in the first ILD layer and that comprises a first metal line;
      depositing a second ILD layer of dielectric material overlying the first ILD layer;
      etching a via-bar trench in the second ILD layer over the first metal line to expose an upper surface of the first metal line, wherein the via-bar trench has a first width;
      etching an upper portion of the second ILD layer adjacent to the via-bar trench to define a metal line trench that is over and open to the via-bar trench, wherein the metal line trench has a second width that is from about 1 to about 5 times the first width;
      forming a first via-bar in the via-bar trench coupled to the first metal line; and
      forming a second metal line in the metal line trench coupled to the first via-bar, wherein forming the first via-bar comprises forming the first via-bar gouging into the first metal line a depth of about 50 Å or greater, wherein forming the first via-bar and the second metal line comprises:
         forming a liner in the via-bar trench and the metal line trench, wherein forming the liner comprises:
            depositing a liner-forming material to form a liner layer in the via-bar trench and the metal line trench; and etching back portions of the liner layer using an ion bombardment dry etching process so as to drive the liner-forming material into first metal line; and depositing a conductive metal fill in the via-bar trench and the metal line trench overlying the liner.

6. The method of claim 5, wherein etching the upper portion of the second ILD layer comprises forming the metal line trench having the second width of from about 2 to about 5 times the first width.

7. The method of claim 5, wherein etching the upper portion of the second ILD layer comprises forming the metal line trench having the second width of from about 2 to about 4 times the first width.

8. The method of claim 5, wherein depositing the conductive metal fill comprises depositing the conductive metal fill using an electrochemical plating (ECP) process.

9. The method of claim 5, further comprising:

depositing a copper seed layer in the via-bar trench and the metal line trench overlying the liner, and wherein depositing the conductive metal fill comprises depositing the conductive metal fill overlying the copper seed layer.

10. The method of claim 9, wherein depositing the copper seed layer comprises depositing the copper seed layer using a physical vapor deposition (PVD) process.

11. The method of claim 5, wherein forming the liner comprises:

depositing the liner-forming material using a physical vapor deposition (PVD) process.

12. The method of claim 5, further comprising:

depositing additional liner-forming material onto the liner layer to form the liner after etching back the portions.

13. The method of claim 5, wherein forming the liner comprises penetrating the first metal line with the liner-forming material.

14. The method of claim 13, wherein forming the liner comprises penetrating the first metal line with the liner-forming material a depth of about 50 Å or greater.

* * * * *